United States Patent
Goergen et al.

(10) Patent No.: US 10,932,387 B2
(45) Date of Patent: Feb. 23, 2021

(54) QUICK RELEASE FOR ONLINE INSERTION AND REMOVAL OF A MODULE IN A DISTRIBUTED NETWORK SYSTEM

(71) Applicant: CISCO TECHNOLOGY, INC., San Jose, CA (US)

(72) Inventors: Joel Richard Goergen, Soulsbyville, CA (US); Rohit Dev Gupta, Bangalore (IN); Paolo Sironi, Gallarate (IT)

(73) Assignee: CISCO TECHNOLOGY, INC., San Jose, CA (US)

( * ) Notice: Subject to any disclaimer, the term of this patent is extended or adjusted under 35 U.S.C. 154(b) by 13 days.

(21) Appl. No.: 16/230,194

(22) Filed: Dec. 21, 2018

(65) Prior Publication Data

US 2019/0364686 A1   Nov. 28, 2019

Related U.S. Application Data

(60) Provisional application No. 62/676,723, filed on May 25, 2018.

(51) Int. Cl.
*H05K 7/14* (2006.01)
*H05K 5/02* (2006.01)

(52) U.S. Cl.
CPC ......... *H05K 7/1489* (2013.01); *H05K 5/0204* (2013.01); *H05K 5/0221* (2013.01); *H05K 7/1491* (2013.01)

(58) Field of Classification Search
CPC .. H05K 7/1489; H05K 5/0204; H05K 5/0221; H05K 7/1491; H04Q 1/02
See application file for complete search history.

(56) References Cited

U.S. PATENT DOCUMENTS

| | | | |
|---|---|---|---|
| 6,452,805 B1 * | 9/2002 | Franz | G06F 1/16 361/724 |
| 6,644,481 B2 * | 11/2003 | Dean | H05K 7/1489 211/190 |
| 7,325,150 B2 | 1/2008 | Lehr et al. | |
| 8,405,983 B2 * | 3/2013 | Chen | G06F 1/181 165/104.33 |
| 9,326,414 B2 * | 4/2016 | Eberle, Jr. | H05K 7/1489 |
| 10,167,891 B1 * | 1/2019 | Arenella | F16B 5/0635 |

(Continued)

FOREIGN PATENT DOCUMENTS

WO    WO2014134218 A1    9/2014

OTHER PUBLICATIONS

Cisco.com, Cisco ASR 9000 Series Aggregation Services Router Overview and Reference Guide, cisco.com, Oct. 11, 2018.

*Primary Examiner* — Hung S. Bui
*Assistant Examiner* — Sagar Shrestha
(74) *Attorney, Agent, or Firm* — Cindy Kaplan

(57) ABSTRACT

In one embodiment, as apparatus includes a quick release system for installation of a module of a network communications system in a rack and removal of the module from the rack, the quick release system comprising a rack bracket for attachment to the rack, the rack bracket comprising a ground lug for providing a ground connection, and a module bracket for attachment to the module, the module bracket comprising a thumb screw for securely connecting the module bracket to the rack bracket. A method for installing the module on the rack is also disclosed herein.

17 Claims, 14 Drawing Sheets

(56) References Cited

U.S. PATENT DOCUMENTS

| | | | |
|---|---|---|---|
| 2004/0001320 A1* | 1/2004 | Baar | H05K 7/1424 |
| | | | 361/727 |
| 2005/0254210 A1* | 11/2005 | Grady | H05K 7/20581 |
| | | | 361/695 |
| 2011/0243031 A1* | 10/2011 | Aybay | H04L 49/00 |
| | | | 370/254 |
| 2013/0067248 A1* | 3/2013 | Wang | H05K 7/1492 |
| | | | 713/300 |
| 2014/0253289 A1* | 9/2014 | Groth | H05K 7/1498 |
| | | | 340/8.1 |
| 2015/0116913 A1* | 4/2015 | Kwon | H05K 7/1492 |
| | | | 361/624 |
| 2016/0070282 A1 | 3/2016 | Chapel et al. | |
| 2017/0257969 A1* | 9/2017 | Kuan | H05K 7/1489 |
| 2017/0329371 A1 | 11/2017 | Schmidtke et al. | |
| 2017/0367211 A1* | 12/2017 | Easton | H05K 7/183 |
| 2017/0374768 A1* | 12/2017 | Hughes | H05K 7/1487 |
| 2019/0074668 A1* | 3/2019 | Huang | H02B 1/48 |

\* cited by examiner

QUICK RELEASE FOR ONLINE INSERTION AND REMOVAL OF A MODULE IN A DISTRIBUTED NETWORK SYSTEM

STATEMENT OF RELATED APPLICATION

The present application claims priority from U.S. Provisional Application No. 62/676,723, entitled METHOD AND APPARATUS FOR COMPONENT REPLACEMENT IN A VIRTUAL DECENTRALIZED TRANSPORT SYSTEM, filed on May 25, 2018. The contents of this provisional application are incorporated herein by reference in its entirety.

TECHNICAL FIELD

The present disclosure relates generally to communication networks, and more particularly, to a quick release system for online insertion and removal of modules in a distributed network system.

BACKGROUND

In a network system, OIR (Online Insertion and Removal) describes a process of replacing a module (e.g., product upgrade, failed module replacement) while the network system is operational, without disrupting performance of the network system. During this process, the system continues to be functional and a faulty module is replaced with a new or repaired module.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
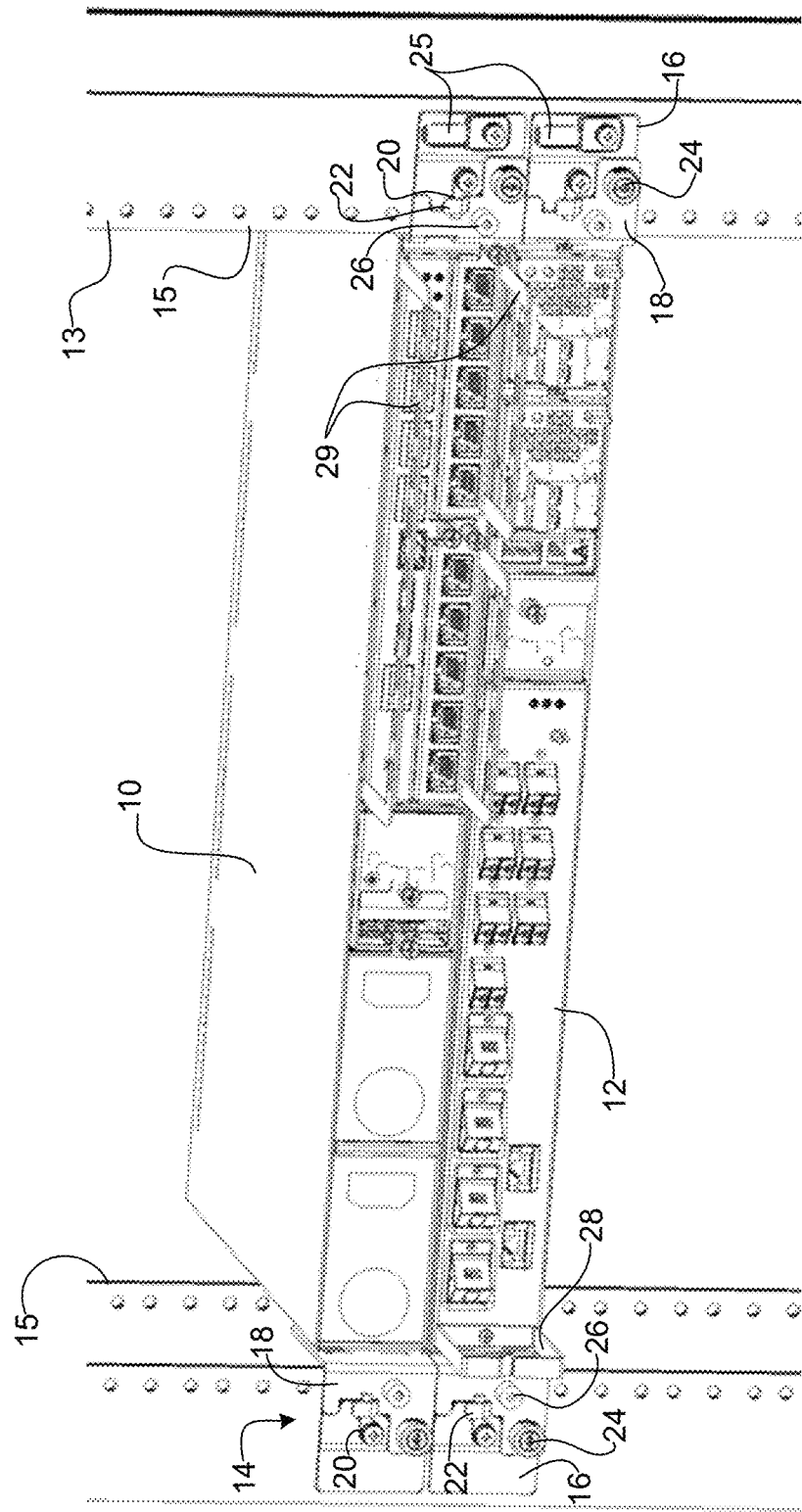
FIG. 1 is a perspective of modules attached to rack posts with a quick release system, in accordance with one embodiment.

In one embodiment, an apparatus generally comprises a quick release system for installation of a module of a network communications system in a rack and removal of the module from the rack, the quick release system comprising a rack bracket for attachment to the rack, the rack bracket comprising a ground lug for providing a ground connection, and a module bracket for attachment to the module, the module bracket comprising a thumb screw for securely connecting the module bracket to the rack bracket.

In one or more embodiments, one of the rack bracket and the module bracket comprises a rotatable lever for engagement with a hook on the other of the rack bracket and the module bracket. The rack bracket may further comprise a guide pin for insertion into a connector on the module bracket, wherein the guide pin and the connector provide a grounding connection between the rack bracket and the module bracket. The ground lug may be located on one or both of the rack brackets for mounting on rack posts of the rack.

In one or more embodiments, the rack bracket and the module bracket each comprise a slide rail extending rearward from a front portion of the rack bracket or the module bracket for sliding engagement during insertion of the module.

In one or more embodiments, the module comprises a 1RU (rack unit) line card. In one or more embodiments, the module comprises a 2RU or larger chassis for receiving components.

In one or more embodiments, the module is in communication with other modules mounted on the rack to form a distributed network system. The module may receive power or power over Ethernet from another module mounted on the rack.

In another embodiment, a distributed network system generally comprises a plurality of modules mounted on one or more racks and quick release systems for installation of the modules on the rack and removal of the modules from the rack. Each of the quick release systems comprises two rack brackets attached to rack posts of one of the racks, at least one of the rack brackets comprising a ground lug for providing a ground connection, and two module brackets attached to opposite sides of a module, each of the module brackets comprising a thumb screw for securely connecting the module bracket to the rack bracket.

In yet another embodiment, a method for installing a module on a rack in a network communications system generally comprises inserting the module between two rack posts of the rack, aligning module brackets attached to opposite sides of the module with rack brackets attached to the rack posts, and tightening thumb screws on the module brackets to securely connect the module brackets to the rack brackets. At least one of the rack brackets comprises a ground lug that remains on the rack during removal of the module.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Centralized chassis infrastructures typically include a plurality of modules (e.g., controller, line cards, fabric cards) installed within a single enclosure (chassis). For example, transport routing systems may incorporate dual route processor/controllers (RP/C) in a chassis configuration comprising 2 RP/C cards, x number of line cards, y number of fabric cards, and z number of power supplies. The cards may communicate over several back plane or mid plane methods, such as a dedicated control bus between the 2 RP/C cards, data bus between the line cards and the fabric cards, simple control bus to all cards from the RP/C to collect statistics, as well as other communication paths incorporated within the chassis. In order to allow for growth, power allocation is sized according to the power supplies installed rather than the power actually being used. This arrangement often results in a significant waste of resources to an end user. In addition to allocated but unused power, the centralized system may also include unused cooling and consume a large amount of space.

One solution to address the above issues is to add several 1RU (rack unit) modules and interconnect the modules together. If facility power is needed for each module, further electrical build out is needed and more allocated power may be unused. Another drawback is with respect to OIR (Online Insertion and Removal). OIR refers to a process of replacing a module for repair (e.g., failed module replacement) or upgrade (e.g., product upgrade) without disrupting performance of the modular system. During this process, the system continues to be functional and a faulty module is replaced with a new or repaired module. In conventional systems, replacement of a line card mounted on a rack requires disconnection of a ground wire, removal of a ground lug (e.g., two screws), and removal of screws on a rack mounted bracket (e.g., six screws/RU), and the same process in reverse to install a new line card. These drawbacks may make the rack based 1RU module solution no more cost advantageous than a full chassis system.

The embodiments described herein provide a distributed (decentralized) network system that incorporates a grounding system with a mechanical quick release (for quick removal or installation) to achieve OIR performance of a standard line card or fabric card in a typical large chassis configuration, in a rack mounted distributed infrastructure. The distributed network system may allow, for example, optimized size based on capacity requirements, optimized power supply to support individual line card power, and an optimized fan tray to support individual line card cooling. Also, only individual line cards need to be replaced without impacting other line cards.

The quick release system described herein reduces network down time and provides an improved user experience in a distributed network system or other rack mounted system. The quick release system allows individual modules (line cards, fabric cards, controller cards, route processor cards, and the like) to be mounted with a ground connection that does not interfere with line card replacement, thereby allowing for quick OIR for 1RU, 2RU, or 3RU distributed network components (modules). In one or more embodiments, the quick release system is configured to allow for easy and fast replacement of a module within a five minute traditional OIR time in a central office environment. The quick release system allows a basic level technician to easily replace powered equipment (e.g., PoE_E powered device) without special tools or the need for special personnel such as an electrician. Typical methods to replace conventional 1RU equipment would require tools to remove screws (e.g., six or more) and a ground wire, as well as facility power and all of the associated cabling. The embodiments described herein minimize OIR time, require no tools, and provides an efficient OIR process. As described in detail below, the quick release system includes thumb screws and optional latches that provide for quick release from the rack structure and OIR of the module. A grounding feature further reduces OIR time by eliminating the need to remove ground wires for module replacement.

The embodiments described herein may operate in the context of a network communications system including multiple network devices (modules or groups of modules). The network may be configured for PoE (including, for example, PoE_E) and include any number of network devices in communication via any number of nodes (e.g., routers, switches, gateways, controllers, edge devices, access devices, aggregation devices, core nodes, intermediate nodes, or other network devices), which facilitate passage of data within the network. The network devices may communicate over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, Internet of Things (IoT) network, radio access network, public switched network, or any other network).

In one or more embodiments, the network device includes one or more programmable machines that may be implemented in hardware, software, or any combination thereof. The network device may include one or more processor, memory, and network interface. Memory may be a volatile memory or non-volatile storage, which stores various applications, operating systems, modules, and data for execution and use by the processor. The network interfaces may comprise any number of interfaces (e.g., line cards, ports, optical modules) for receiving data or transmitting data to other devices. The network interfaces may also be configured for receiving/transmitting power over Ethernet and power may be transmitted between power supply components within the network system.

The embodiments may operate, for example, in a distributed network system comprising any number of modules (e.g., line card, fabric card, route processer/controller card, and the like). The distributed network may include modules on the same rack or separate racks remotely connected through power cables, data cables, PoE cables, or any combination thereof. The route processor/controller card may be configured to handle control plane and messaging and may comprise one or more power supply units. In one or more embodiments, power received at a power supply unit is converted to PoE_E where up to 350W of power and 10 GE of communications control plane bandwidth are delivered to line cards and fabric cards. Each module may include any number of interfaces (e.g., optical interfaces, console network management ports, control ports, and the like), power supply units, or fans (fan trays). The power supply units may be used for power entry from facility power converted to an internal defined voltage (e.g., 56V or other voltage). Console ports may be used for network management and configuration, software downloads, or other means. The fan tray may comprise one or more fans for cooling. Control ports may provide Ethernet based communications combined with an enhanced power over Ethernet system, for example. In one or more embodiments, these ports may deliver more than 300 Watts of PoE_E, along with communications ranging from 100 Mbps to 10 Gbps Ethernet (or any other value or range), all on a single cable. The control ports connect to each part of the system, such as line cards, fabric cards, or other defined cards as needed in an optical transport system. The cables deliver power and communications for the control plane to the line cards and fabric cards. When redundancy of the control/power plane is needed, dual route processor/control cards may be used. For example, two separate links may connect each RP/C to a line card. The two links may provide redundant power and control plane link to the line card so that the line card has redundant power and redundant control planes.

The line cards may include optical modules, ROADM (reconfigurable optical add-drop multiplexer) components, transport communication components, or any combination of these and other components. Line card functions may be integrated in a 1RU (rack unit) box. The fabric card may include fabric plane components to interface to a line card that supports a 2+1 redundant fabric plane implementation, for example. In one or more embodiments, the line cards and fabric cards may be powered with 350 W (or other power level) enhanced mode PoE or PoE built in as power over communications cabling in the control plane distribution.

It is to be understood that the distributed network system and modules described above are only examples and the quick release system described herein may be used to mount any type of module on a rack in any arrangement and in any type of rack mounted network communications system for quick installation and removal.

Referring now to the drawings, and first to FIG. 1, an example of a distributed network infrastructure comprising modules 10, 12 mounted on a rack 13 with a quick release system, generally indicated at 14, is shown in accordance with one embodiment. In the example shown in FIG. 1, a controller box (control card) 10 and line box (line card) 12 are mounted between two rack posts 15. The quick release system 14 comprises rack brackets 16 mounted on the rack posts 15 (front walls of rack posts) for engagement with module brackets 18 mounted on opposite sides of the modules. The module brackets 18 each comprise a side portion attached to opposite sides of the module 10, 12 and a front portion extending generally 90 degrees from the side portion for attachment to the rack bracket 16. As described in detail below, the rack bracket 16 includes a rotatable lever 20 for engagement with a hook 22 extending outward from the module bracket 18, a threaded opening (shown in FIG. 4) for receiving a thumb screw 24 attached to the module bracket 18, and a guide pin (shown in FIGS. 4, 6A, and 6B) for sliding engagement into an opening formed in connector 26 on the module bracket. At least one of the rack brackets 16 further comprises a ground lug 25 for receiving a ground wire and creating a ground connection. As described below with respect to FIG. 5, the ground lug may have different configurations than shown in FIG. 1. Since the ground lug 25 is attached to the rack bracket 16, there is no need to remove the ground wire for module removal.

The modules 10, 12 may comprise one or more cable management brackets 28, 29. In the example shown in FIG. 1, a cable support bracket 28 is attached to a front plate of the module 12 and cable support brackets 29 are attached to the module 10 (e.g., components of the module). Brackets 29 may also be used as a handle to remove components from the module 10. In the example shown in FIG. 1, fibers may exit on the left (as viewed in FIG. 1) along with power and ground cables. Management cables may exit on the right side of the rack (as viewed in FIG. 1). Velcro may also be used on cable management brackets to secure power over data cables, for example.

As described below with respect to FIGS. 7A-10, the rack and module quick release brackets 16, 18 may be replaced with brackets comprising slide rails. The rack mount brackets 16, 18 may be used, for example, with lighter weight line cards that can be lifted with a single hand, while the slide rails may be used with heavier line cards or modules. Both configurations allow for module removal by unfastening thumb screws and without removing ground connections.

Figure 11A:
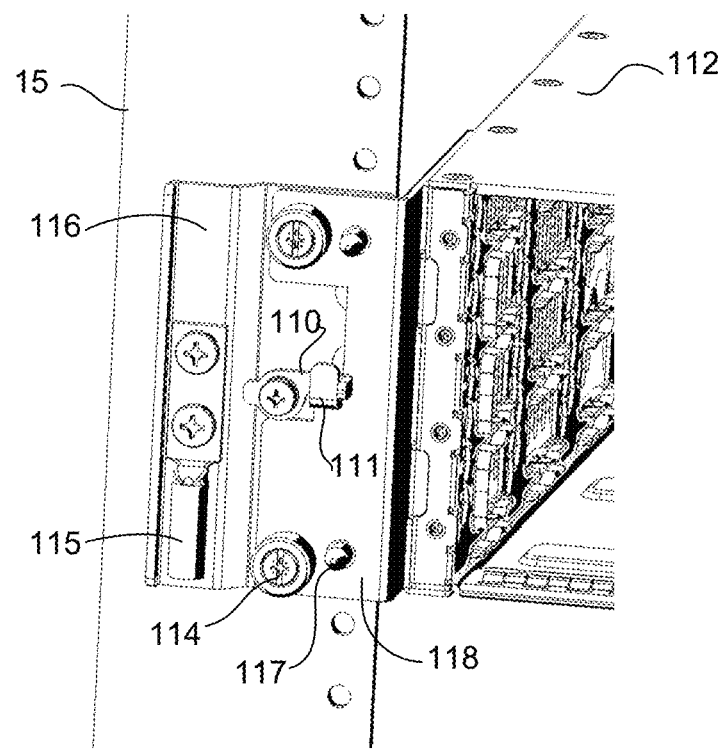
FIG. 11A is a partial perspective of a 2RU module attached to a 19 inch rack with the quick release system.
Figure 11B:
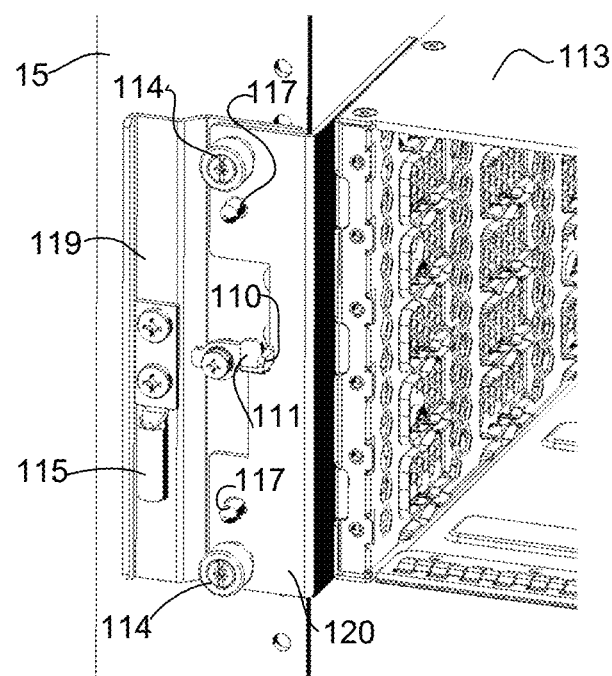
FIG. 11B is a partial perspective of a 3RU module attached to the 19 inch rack with the quick release system.
Figure 12A:
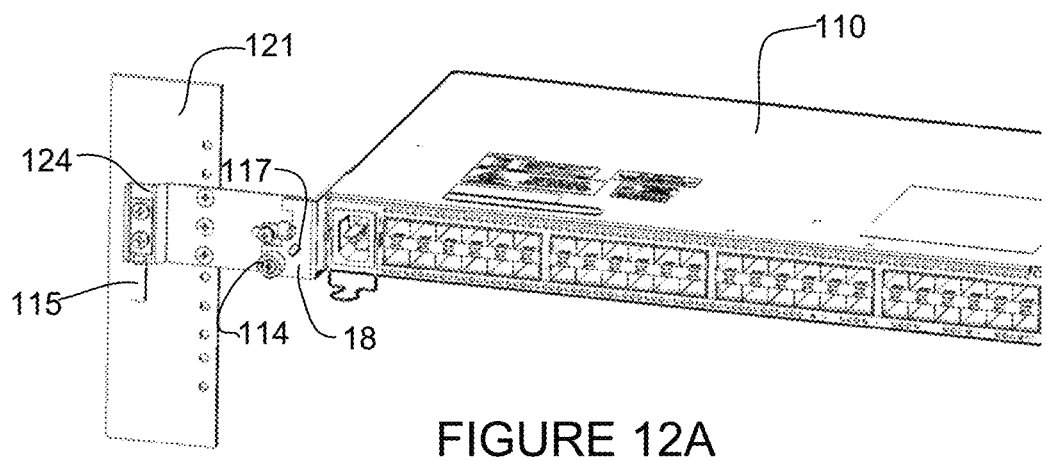
FIG. 12A is a partial perspective of a 1RU module attached to a 23 inch rack with the quick release system.
Figure 12B:
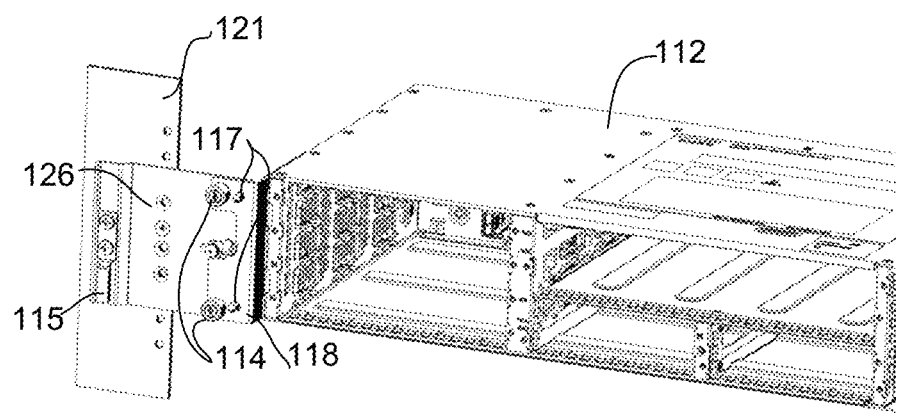
FIG. 12B is partial perspective showing the 2RU module attached to the 23 inch rack with the quick release system.
Figure 12C:
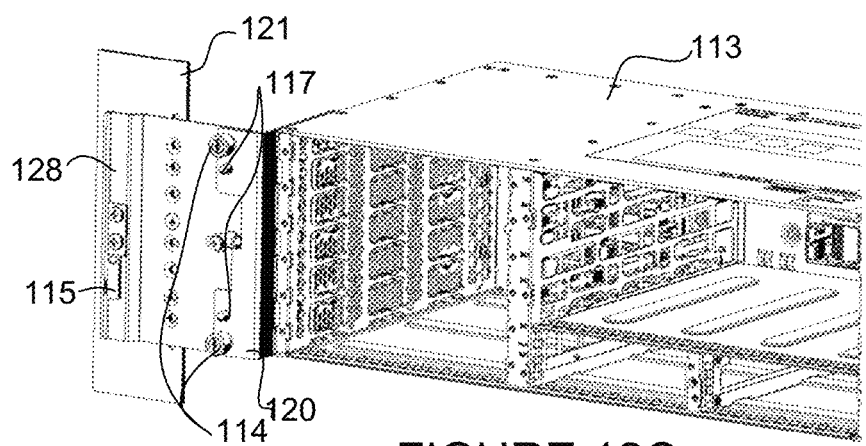
FIG. 12C is a partial perspective showing the 3RU module attached to the 23 inch rack with the quick release system.
Figure 13A:
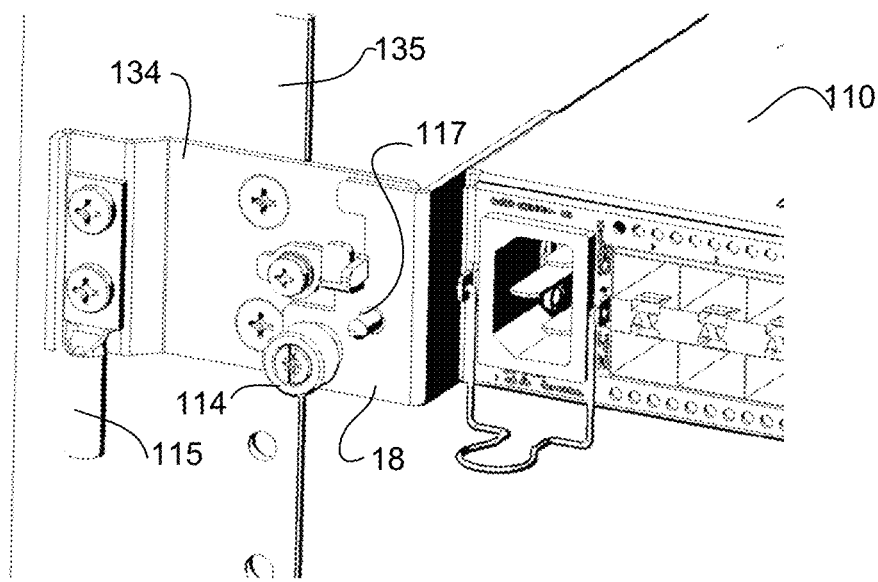
FIG. 13A is a partial perspective showing the 1RU module attached to an ETSI rack with the quick release system.
Figure 13B:
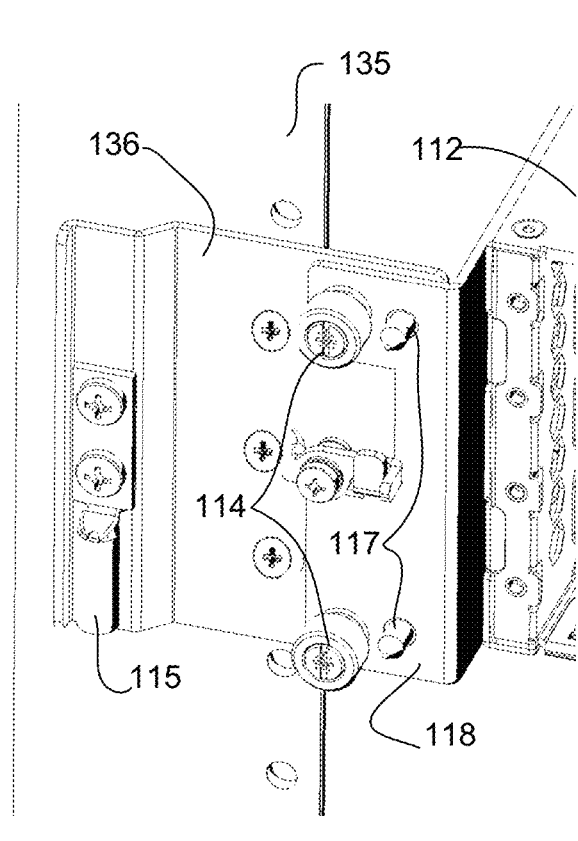
FIG. 13B is a partial perspective showing the 2RU module attached to the ETSI rack with the quick release system.
Figure 13C:
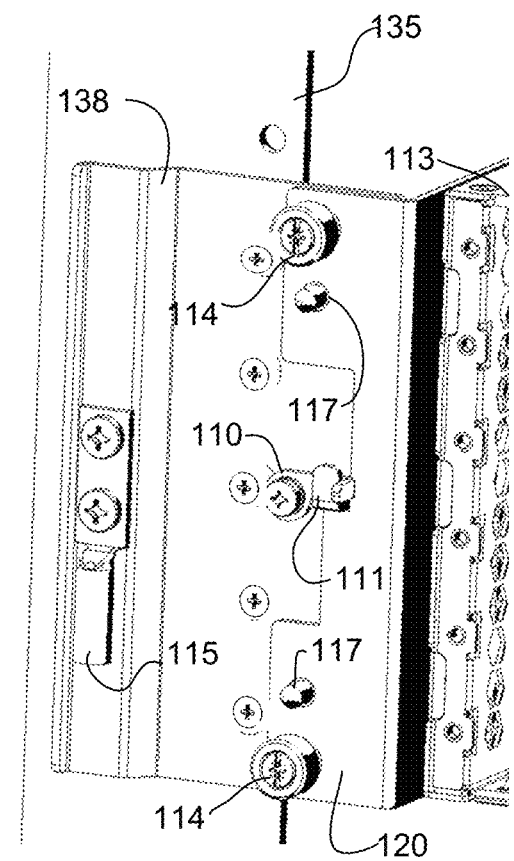
FIG. 13C is a partial perspective showing the 3RU module attached to the ETSI rack with the quick release system.

The quick release system shown in FIG. 1 is also applicable to 2RU and 3RU modules (or other size modules), as described below with respect to FIGS. 11A and 11B (and FIGS. 12A-13C for different racks). The examples shown in FIGS. 1, 11A, and 11B are for a standard 19" rack. The rack may also comprise, for example, a 23" network rack (as shown in FIGS. 12A-12C), an ETSI (European Telecommunications Standards Institute) rack (as shown in FIGS. 13A-13C) or any other type or size rack. The rack post width may be, for example, 50 mm, 2.19", 2.1", or any other width. The rack opening may be, for example, 21.50", 17.5", 17.75", or any other suitable width.

Figure 2A:
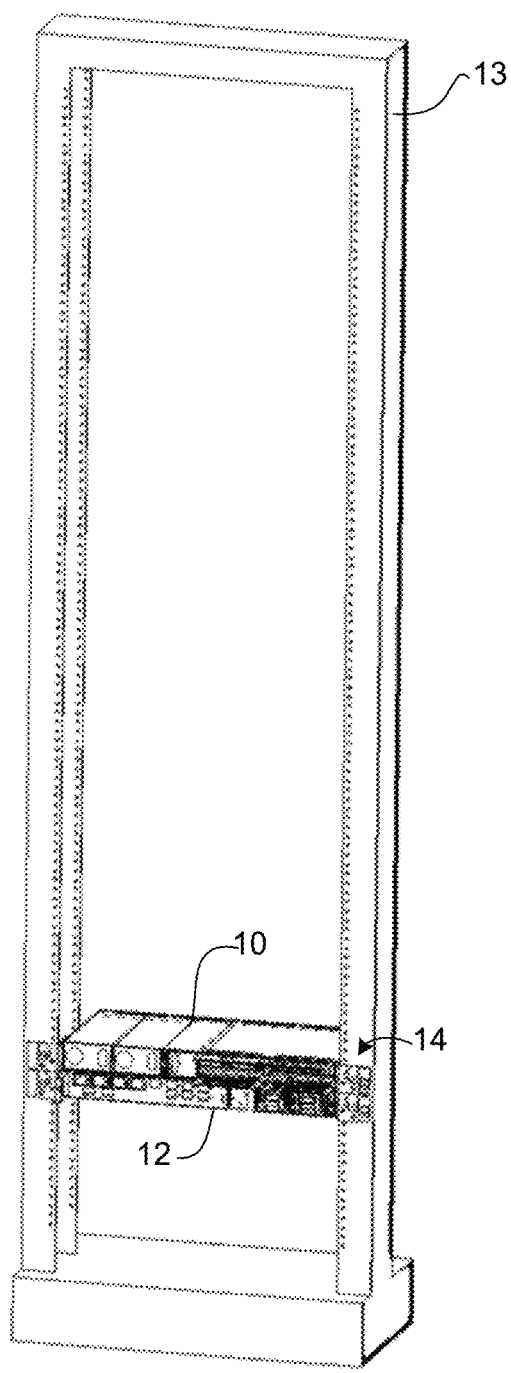
FIG. 2A shows the modules of FIG. 1 mounted in a rack.
Figure 2B:
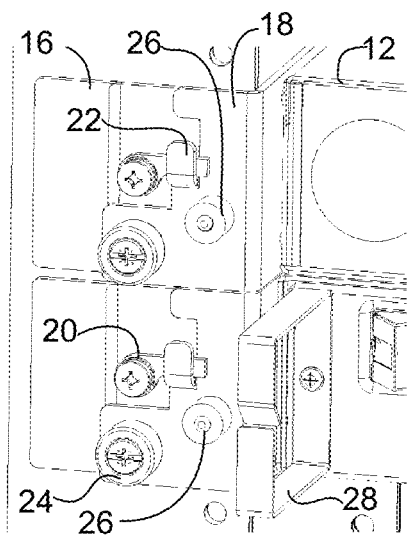
FIG. 2B is an enlarged view showing a left side of the modules attached to the rack post with the quick release system.
Figure 2C:
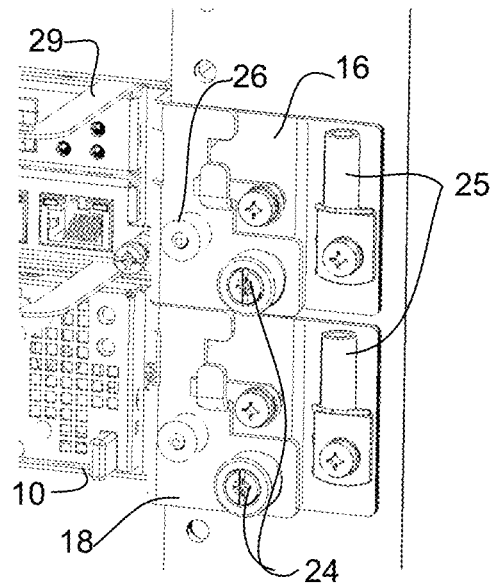
FIG. 2C is an enlarged view showing a right side of the modules attached to the rack post with the quick release system.

FIG. 2A shows the controller 10 and line card 12 installed on the rack 13. Any number of modules may be installed in the rack (above or below the two mounted modules shown). The modules may form one or more distributed network systems. FIGS. 2B and 2C are enlarged perspective views of the left side and right side, respectively, of the quick release system 14 shown in FIG. 2A. In the example shown in FIGS. 2A-2C, the right side rack bracket 16 includes the ground lug 25, however, the ground lug may be included on either bracket (left or right) or both. As previously noted, each module bracket 18 includes at least one thumb screw 24, connector 26, and the hook 22 for receiving the rotating lever 20. The lever 20 and hook 22 may also be switched so that the lever 20 is on the module bracket 18 and the hook 22 is on the rack bracket 16.

Figure 3:
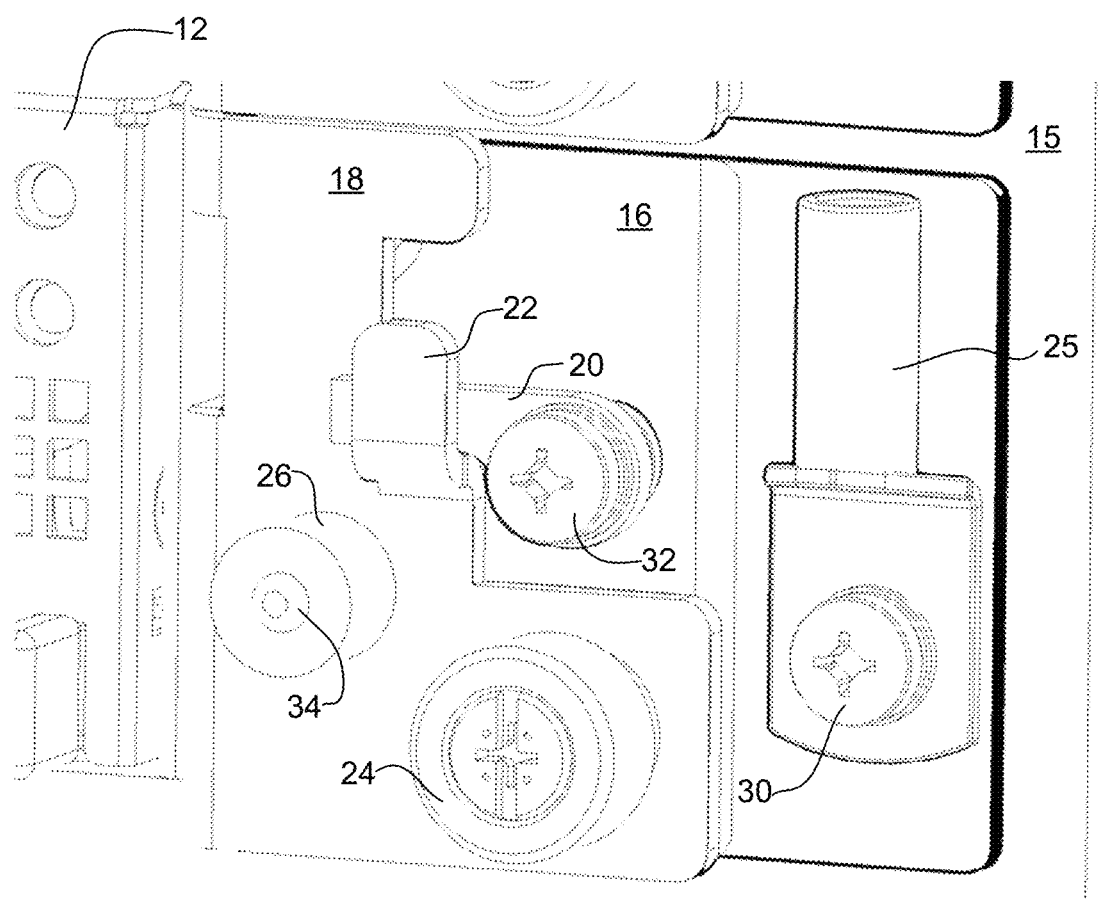
FIG. 3 is an enlarged view showing details of the quick release system shown in FIG. 2C.

FIG. 3 is an enlarged view of the right side of the quick release system showing details of the rack bracket 16 and module bracket 18. The rack bracket 16 is assembled on the rack post 15. The ground lug 25 is connected to the rack bracket 16 with screw 30 (or other suitable fastener). As previously noted, the ground lug 25 may have a different configuration than shown in FIG. 3, as described below with respect to FIG. 5. The module bracket 18 includes the thumb screw 24, which may be tightened or loosened by hand to install or remove the module 12. As described below with respect to FIGS. 6A and 6B, the connector 26 on the module bracket 18 receives a guide pin 34 extending outward from the rack bracket 16. The connector 26 and ground pin 34 may be used to align the brackets 16, 18 during module installation and may also provide a ground connection between the brackets to ensure proper ground connection and continuity. The lever 20 engages with the U-shaped hook 22 to avoid accidental slip on the guide pin. One of the brackets 16, 18 may include a marking (e.g., lock/unlock with arrow) indicating the direction to move the lever to lock or unlock the quick release system 14. The module 12 is secured in place on the rack by finger tightening the thumb screw 24 to attach the module bracket 18 to the rack bracket 16. Only one side of the quick release system is shown in FIG. 3 for simplification. The same process is also performed for the bracket located on the other side of the module.

In one or more embodiments, the connector 26 and guide pin 34 may not be needed. In one example, an anti-rotation ridge may be included on the rack bracket to prevent rotation between the two brackets 16, 18, avoid rotation of single hole ground lugs, and provide a physical separation between the ground lug 25 and rotating lever 20 to prevent fingers from touching the ground lug during lever rotation. In one example, ground contacts may be sufficient with the thumb screw 24 in the case of low power PoE input, but for high power systems or where the facility power directly terminates to the equipment, the ground contact pin 34 and connector 26 may be needed.

Figure 4:
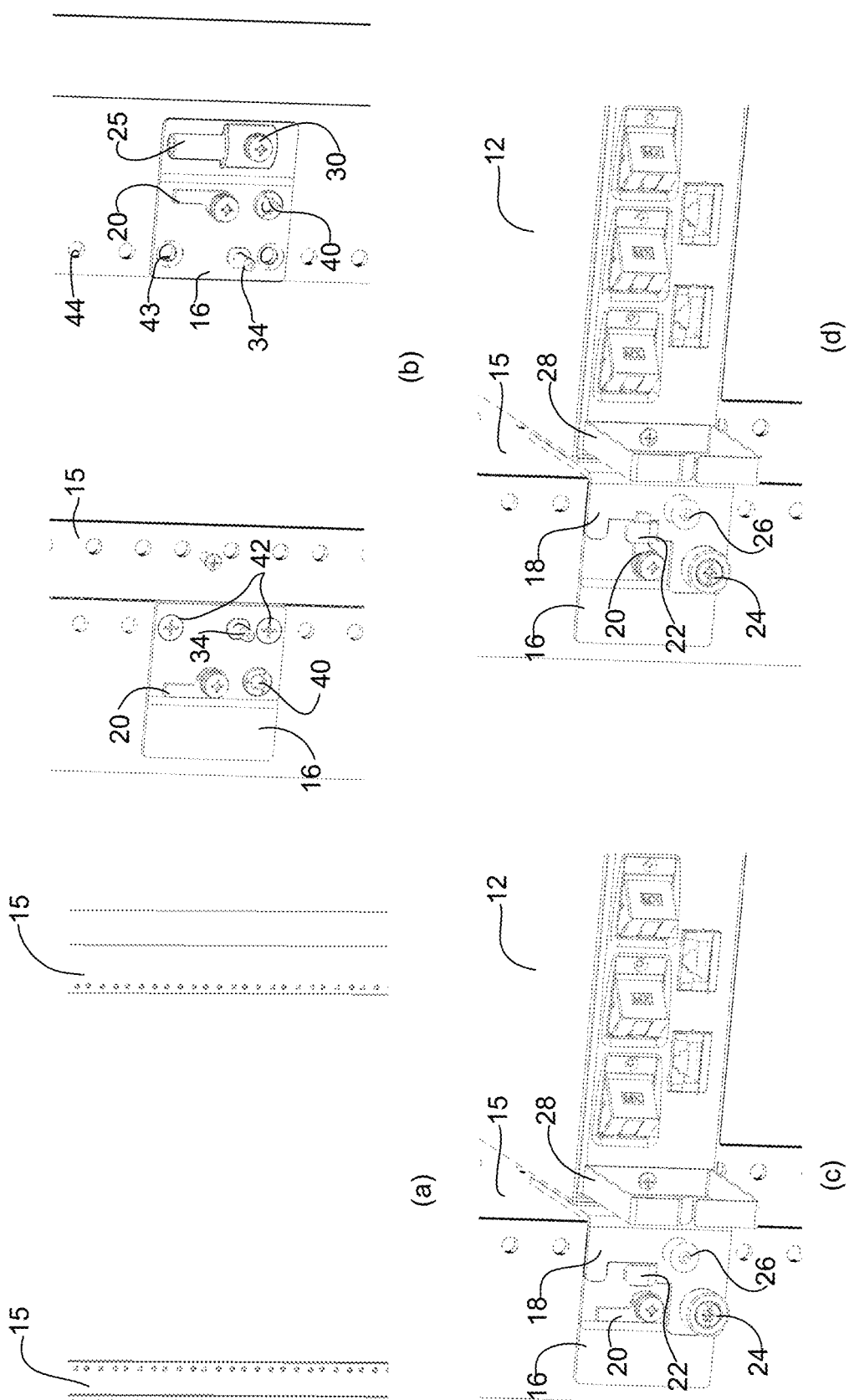
FIG. 4 illustrates an assembly sequence for mounting the module on the rack with the quick release system shown in FIG. 1.

FIG. 4 illustrates an assembly sequence for the quick release system shown in FIG. 1, in accordance with one embodiment. Step (a) shows the rack posts 15. As previously described, the quick release system may be installed on any rack or rack post configuration. The rack brackets 16 are mounted on each rack post 15 with the levers 20 positioned in their unlocked (upward pointing) position (step (b)). The rack bracket 16 may be mounted on the posts 15 with screws 42 inserted into aligned openings 43, 44 on the rack bracket 16 and rack post 15. The openings 43 on the rack bracket 16 may be countersunk to allow the module bracket 18 to be installed generally flush with the rack bracket. The guide pins 34 and openings 40 for receiving the thumb screws 24 are shown in step (b). The module brackets 18 are attached to the sides of the module 12, as previously described. The module 12 is then inserted in the rack, between the rack posts 15 and the module brackets 18 are aligned with the rack brackets 16 on the rack posts 15 using the guide pins 34 and connectors 26 (step (c)). The lever 20 is rotated to engage with the hook 22 on the module bracket 18 and the thumb screw 24 fastened (finger tightened) on both sides (step (d)). The module 12 is now securely mounted on the rack.

In order to remove the module, a reverse process is performed. The thumb screws 24 are loosened and the levers 20 are rotated to their unlocked position. The module 12 may then be removed from the rack. Since the ground lug 25 remains attached to the rack post 15 by the rack bracket 16, there is no need to remove the ground wire.

Figure 5:
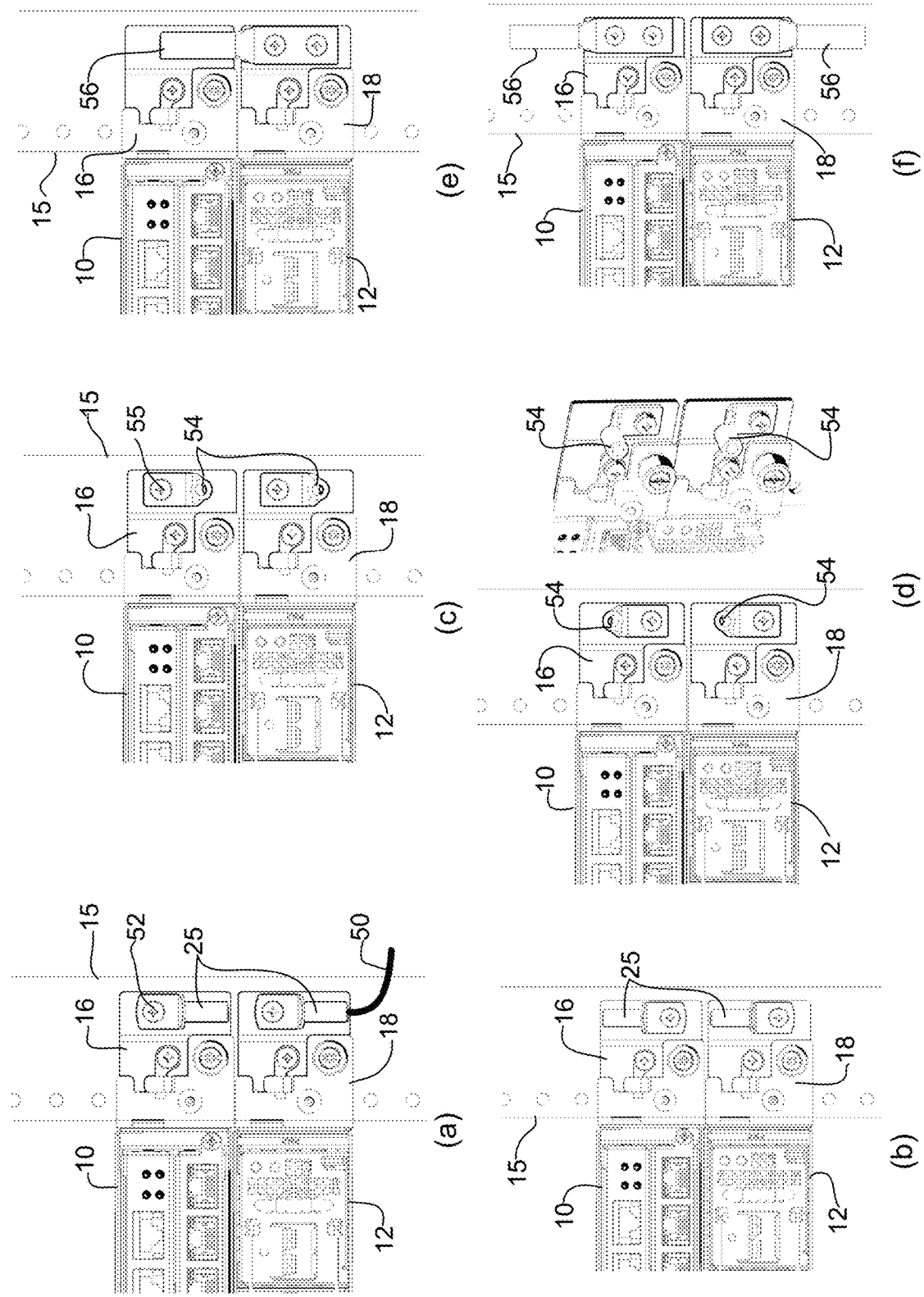
FIG. 5 illustrates examples of ground lugs that may be used with the quick release system.

FIG. 5 illustrates examples of ground lug options. In the examples shown in (a) and (b) the ground lugs 25 extend vertically either downward (a) or upward (b). The mounting location of the ground lug 25 attachment is adjusted on the bracket 16 according to the planned installation direction of the ground lug 25. A ground wire 50 is shown connected to one of the ground lugs 25. In the example shown in (c) and (d), ground lugs 54 extend outward from the rack bracket (e.g., 90 degrees from the bracket), either below attachment screw 55 (c) or above the attachment screw (d). A perspective of the lugs 54 are shown in (d). The example shown in (e) includes only one ground lug 56 that extends to the rack bracket for the module 10 mounted above. In the example shown in (f) two of the ground lugs 56 extend vertically in opposite directions. In the example shown in (e) and (f), each lug includes two openings, one at each end of the lug, providing additional installation options.

Figure 6A:
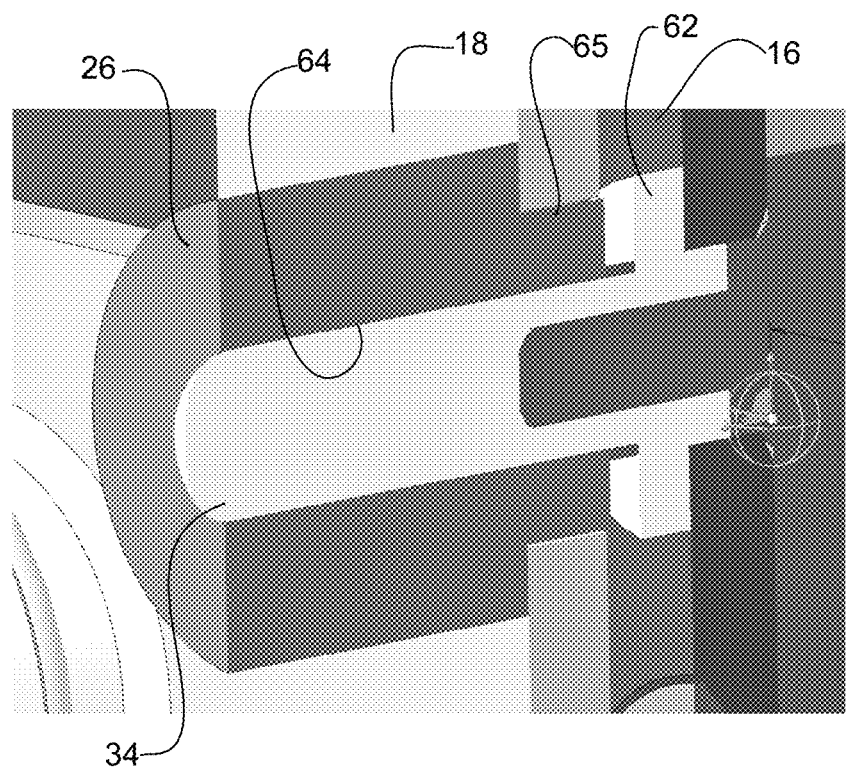
FIG. 6A is a cross-sectional perspective of a guide pin and connector of the quick release system shown in FIG. 1.
Figure 6B:
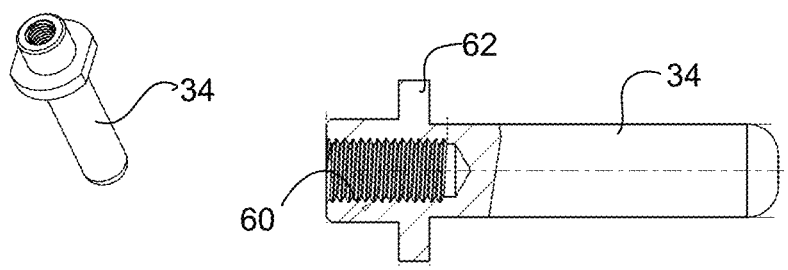
FIG. 6B is a perspective and partial cross-sectional side view of the guide pin shown in FIG. 6A.

FIGS. 6A and 6B show details of the guide pin 34 and connector 26, in accordance with one embodiment. FIG. 6A is a cross-sectional perspective showing assembled guide pin 34 attached to the rack bracket 16 and connector 26 attached to the module bracket 18. FIG. 6B is a perspective and partial cross-sectional view of the guide pin 34. As shown in FIG. 6B, the guide pin 34 includes internal threads 60 for receiving a threaded insert extending outward from the rack bracket 16 and a flange 62. The connector 26 is generally cylindrical in shape with a central opening 64 sized for receiving the guide pin 34. One end 65 of the connector has a reduced outer diameter for attachment to the module bracket 18 (e.g., press-fit or threaded). As previously noted, engagement of the connector 26 and guide pin 34 may provide additional grounding. In one example, the guide pin 34 comprises a RADSERT connector.

Figure 7A:
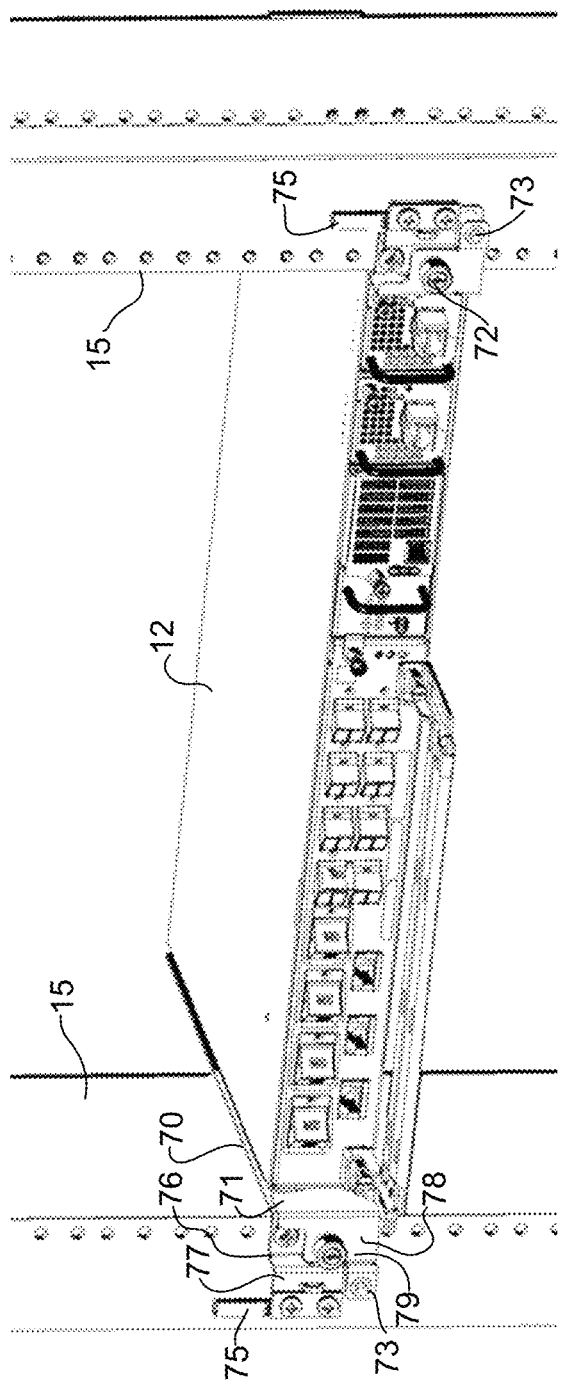
FIG. 7A is a perspective of the module mounted on the rack with a quick release system comprising slide rails, in accordance with one embodiment.
Figure 7B:
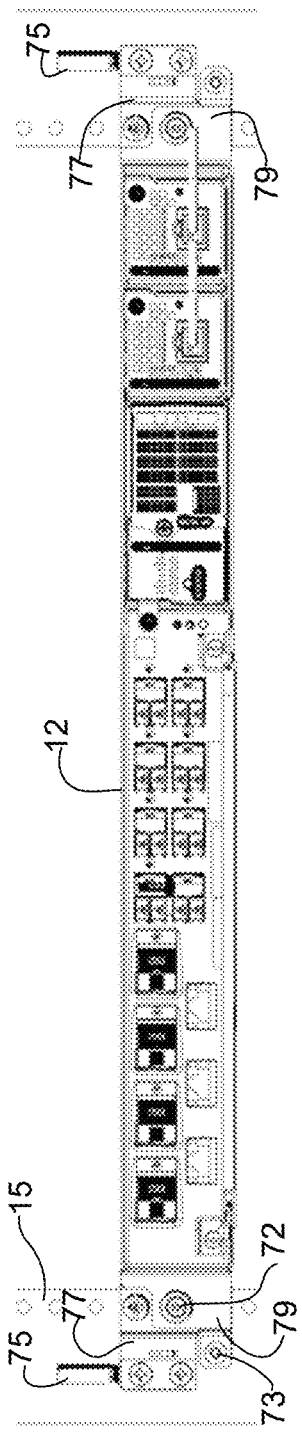
FIG. 7B is a front view of the module and rack shown in FIG. 7A.

FIGS. 7A and 7B illustrate a quick release system comprising rack brackets 76 and module brackets 78 each comprising engaging slide rails 70, 71 positioned on internal sides of the rack posts 15 and external sides of the module 12, respectively. The rack bracket 76 comprises the slide rail 70 and a front portion 77 extending generally 90 degrees from the slide rail and mounted on a front wall of the rack post 15. The module bracket comprises the slide rail 71 and a front portion 79 extending generally 90 degrees from the slide rail for attachment to the rack bracket. In the example shown in FIGS. 7A and 7B, the front portion 77 of each of the rack brackets 70 comprises a ground lug 75 that remains attached to the rack post 15 during module removal and installation, thus eliminating any need to remove a ground wire from the ground lug. The rack bracket 76 includes a guide pin (shown in FIG. 9B) extending outward for insertion into connector 73 attached to the module bracket 78. The module bracket 78 also includes a thumb screw 72 for threaded engagement with an opening (shown in FIG. 9B). Since the slide rails provide stability of the module in the rack during engagement of the connectors 73 and thumb screws 72 with the rack bracket 76, the lever and hook (described above with respect to FIG. 4) may be removed in the slide rail bracket configuration shown in FIGS. 7A and 7B.

Figure 8A:
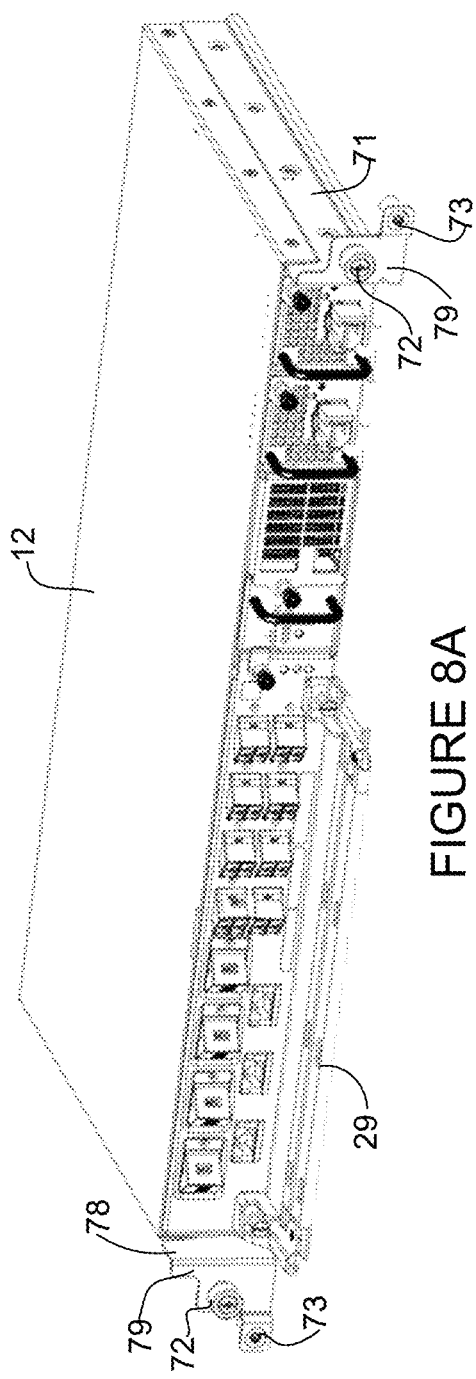
FIG. 8A a perspective the module of FIG. 7A showing slide rails attached to the module.
Figure 8B:
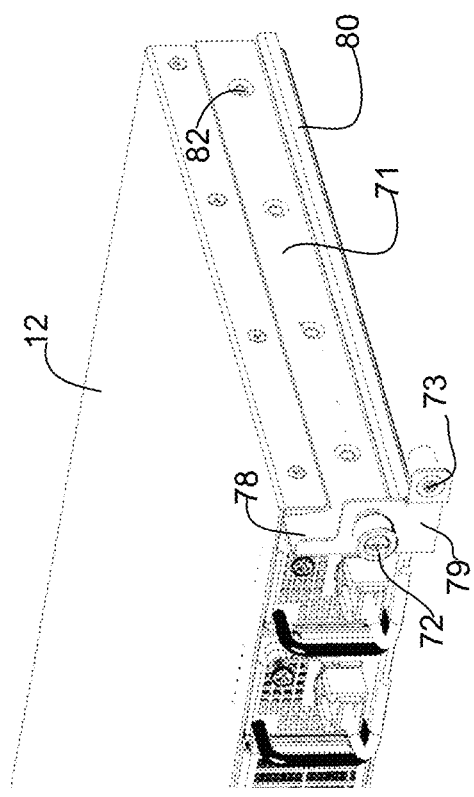
FIG. 8B is an enlarged view of the slide rail attached to the module of FIG. 8A.

FIGS. 8A and 8B show details of the slide rail 71 attached to the sides of the module 12. The connector 73 and thumb screw 72 are attached and extend through the front portion 79 of the module bracket 78 for engagement with a guide pin and post on the front portion 77 of the rack bracket 76 (FIG. 9B). The module bracket 78 may be attached to the module frame with countersunk screws in openings 82 so that a head of the screw does not interfere with sliding movement between the slide rails. The slide rail 71 includes a longitudinal flange 80 extending along a lower portion of the slide rail for engagement with the rack slide rail 70. As previously noted, in this configuration, there is no need for the lever 20 (FIG. 1) since the module 12 is held in place by the interconnecting slide rails 70, 71 prior to tightening of the thumb screws 72.

Figure 9A:
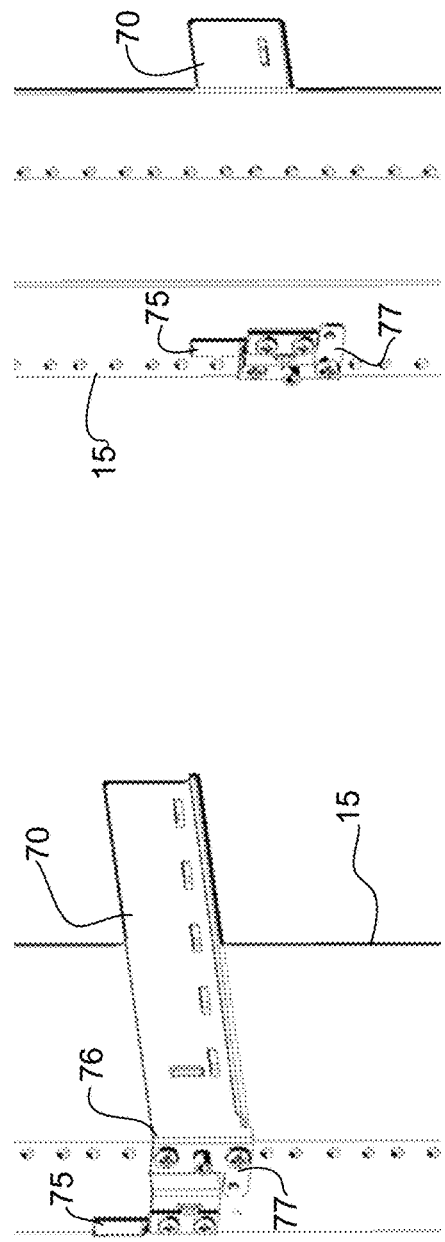
FIG. 9A is a perspective of slide rails mounted on the rack posts for mating with the module slide rails shown in FIG. 8A.
Figure 9B:
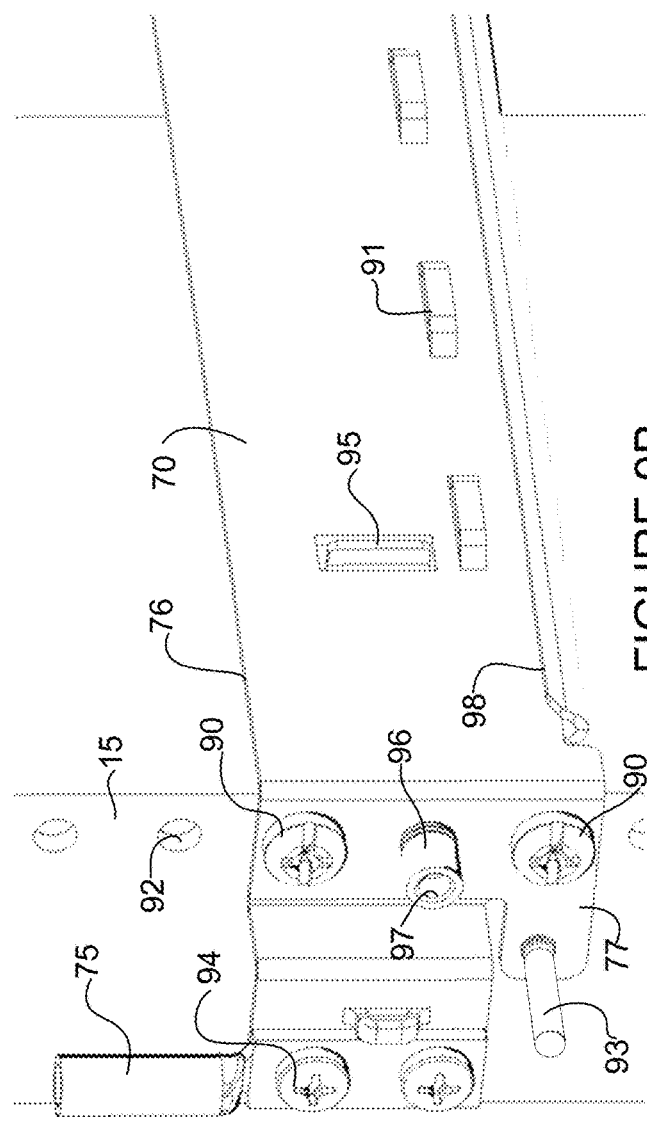
FIG. 9B is an enlarged view showing details of the rack slide rail of FIG. 9A.

FIGS. 9A and 9B show details of the rack bracket 76 attached to the rack posts 15. The rack bracket 76 includes the front portion 77 that is attached to the rack post 15 with screws 90 that extend through openings in the front portion of the rack bracket 76 and openings 92 in the rack post. The slide rail 70 includes a longitudinally extending generally U-shaped groove 98 on a lower portion of the rail. The slide rail 70 may include, for example, one or more ribs 91 to prevent vertical movement of the module during insertion or removal. The slide rail 70 may also include a feature 95 to prevent incorrect installation of the slide rail. A sliding surface of the slide rail 70 may also comprise a coating (e.g., Teflon) to reduce friction between the slide rails.

The ground lug 75 is attached to the front portion 77 of the rack bracket 76 with screws 94. As previously described with respect to FIG. 5, the ground lug 75 may have different configurations than shown in FIGS. 9A and 9B and may be attached on only of the rack brackets 76. The front portion 77 of the rack bracket 76 further comprises post 96 with opening 97 for receiving the thumb screw 72, and guide pin 93 for insertion into connector 73 (FIGS. 8B and 9B). As shown in FIG. 9A, the rack slide rail 70 may extend beyond a side wall of the rack post 15 for engagement with the module slide rail 71 over the length of the module (FIGS. 8B and 9B). The slide rails 70, 71 may include markings to specify which side (left, right) of the module or rack the slide rail should be attached.

Figure 10:
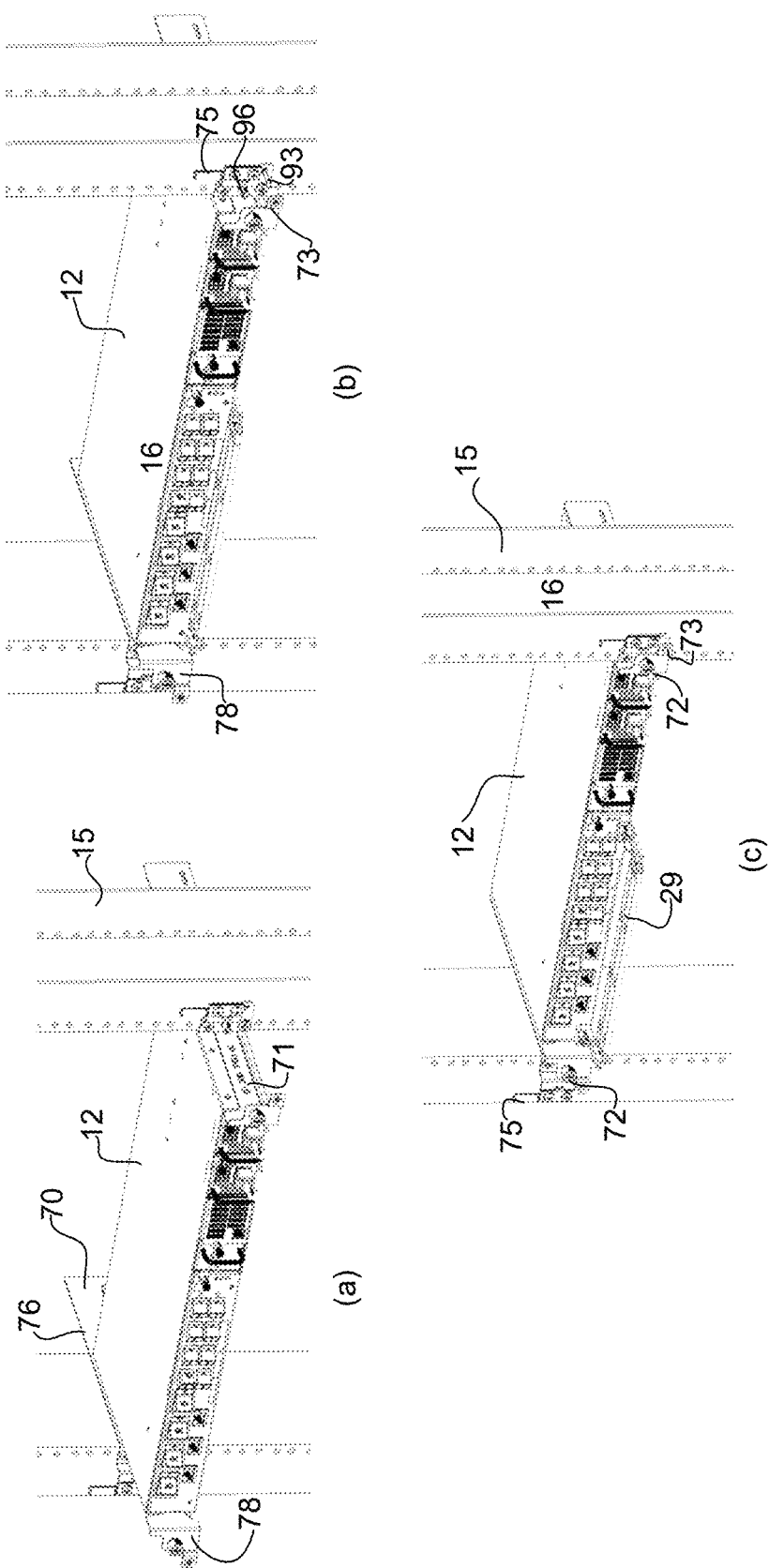
FIG. 10 illustrates an assembly sequence for mounting the module in the rack with the quick release system comprising slide rails shown in FIGS. 7A-9B.

FIG. 10 illustrates an installation sequence for mounting the module 12 with module brackets 78 for engagement with the rack brackets 76. As shown at (a) the module 12 is inserted into the rack with the slide rails 70, 71 on the rack posts 15 and module 12 engaged. The module 12 is then slid to its installed position with the brackets aligned for the connector 73 to receive the guide pin 93 (b). The thumb screws 72 can then be tightened and the installation is complete with the module 12 securely mounted on the rack (c).

The process may be reversed for removal of the module 12 from the rack. As previously described, the ground lug 75 remains mounted on the rack so there is no need to remove the ground wire from the ground lug.

FIG. 11A shows another example of the quick release system for mounting a 2RU module 112 on the rack posts 15. As shown in FIG. 11A, the module 112 may comprise a chassis (enclosure) for receiving one or more components (e.g., power supply, fan, line card, fabric card, controller card). As previously described, the quick release system is configured to allow for quick removal and installation of the module 112 and includes a rack mounted bracket (rack bracket) 116 and a module mounted bracket (module bracket) 118. The rack bracket 116 includes a ground lug 115 and rotatable lever 110, as previously described. The lever 110 may include, for example, a flange as shown in FIG. 11A to prevent transverse movement of the lever once engaged with a hook 111. The module bracket 118 includes the hook 111 for receiving the lever 110, two thumb screws 114, and two guide pins 117. In this example, the guide pins 117 extend outward from the rack bracket 116 through an opening in the module bracket 118. Although not shown, a connector may be attached to the module bracket for receiving the guide pin 117, as previously described.

FIG. 11B shows an example of the quick release system for use in attaching a 3RU module 113 to the rack post 15. The quick release system includes a rack bracket 119 and module bracket 120. The quick release system includes the rack mounted ground lug 115, lever 110, hook 111, thumb screws 114 and guide pins 117, as previously described with respect to FIG. 11A. The brackets 119, 120 are longer to account for the height of the 3RU module 113.

FIGS. 12A, 12B, and 12C illustrate a 1RU module 110, 2RU module 112, and 3RU module 113 mounted on rack posts 121 for a 23 inch rack. In this example, the quick release system comprises the same module bracket 18, 118, 120 shown for the 1RU, 2RU, and 3RU modules connected to the 19 inch rack posts (FIGS. 1, 11B, 11C). A rack bracket 124, 126, 128 is extended to account for the wider opening of the 23 inch bracket 121, as shown in FIGS. 12A, 12B, and 12C. In the examples shown in FIGS. 12A-12C, the 1RU bracket 124 is attached to the rack post 121 with three screws, the rack bracket 126 is attached to the rack post with four screws, and the rack bracket 128 is attached to the rack post with eight screws. It is to be understood that this is only an example and the rack brackets may be attached to the rack posts 121 with any suitable configuration of fasteners.

FIGS. 13A, 13B, and 13C illustrate an example attaching the 1RU module 110, 2RU module 112, and 3RU module 113 to rack posts 135 of an ETSI rack. In this example, the module brackets 18, 118, and 120 are the same as shown in FIGS. 12A-12C. Rack brackets 134, 136, and 138 are configured to accommodate the opening between the rack posts 135 for the ETSI rack.

It is to be understood that the quick release systems shown in FIGS. 11A-13C are only examples and changes may be made without departing from the scope of the embodiments. For example, the number or arrangement of thumb screws 114 and guide pins 117 may be different than shown. Also the ground lug 115 may have different configurations, as previously described. The quick release system may be modified to fit within any rack size or rack post opening. Also, rather than extending the length of the rack bracket to accommodate a larger opening between rack posts, the module bracket may be extended, or both brackets may be extended.

Figure 14A:
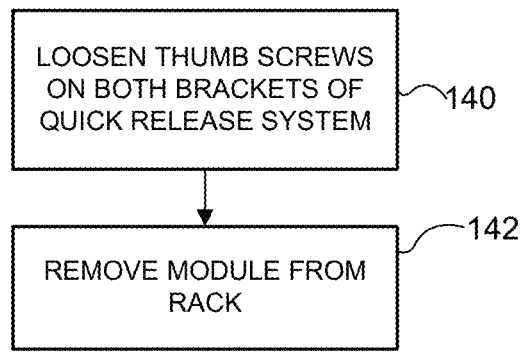
FIG. 14A is a flowchart illustrating an overview of a process for removing the module from the rack using the quick release system, in accordance with one embodiment.

FIG. 14A is a flowchart illustrating an overview of a process for removing the module from the rack with the quick release system described herein. At step 140, thumb screws 24 are loosened (FIGS. 1 and 14A). The module may then be removed from the rack (step 142). If slide rails are used, the module is slid out from the rack. If slide rails are not used, the quick release system may include the lever 20 and hook 22, in which case the lever 20 is rotated to release the lever from the hook 22 and disengage the module bracket 18 from the rack bracket 16 before removing the module.

Figure 14B:
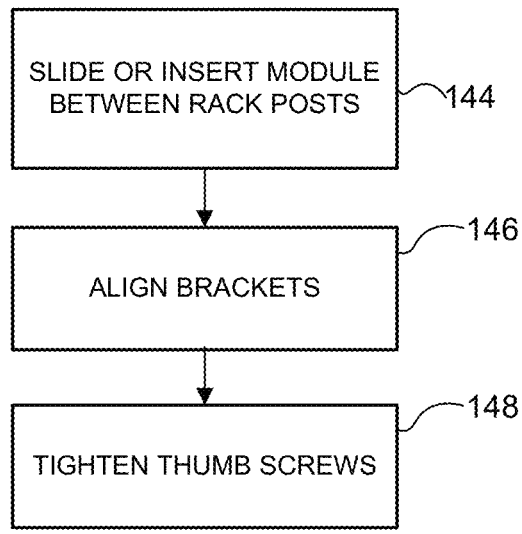
FIG. 14B is a flowchart illustrating a process for installing the module on the rack using the quick release system, in accordance with one embodiment.

FIG. 14B is a flowchart illustrating an overview of a process for installing the module in the rack with the quick release system, in accordance with one embodiment. At step 144 the module is inserted between the rack posts. This may include inserting the module 12 between the rack posts 15 (FIG. 4) or sliding the module between the rack posts with the slide rails on the module and rack posts engaged (FIG. 10). The module bracket attached to the module is aligned with the rack bracket attached to the rack posts (step 146). This may include aligning an opening or connector on the module bracket with a guide pin extending outward from the rack bracket (FIGS. 4 and 10). The thumb screws on each side of the module are then tightened to securely attach the module to the rack (step 148). As previously noted, if slide rails are not used, a lever may be rotated to engage with a hook.

Since the ground lug is attached to the rack bracket and remains on the rack during removal and installation of the module there is no need to remove or reattach ground wires during OIR. In one or more embodiments, the quick release system allows for a five minute OIR.

It is to be understood that the processes shown in FIGS. 14A and 14B and described above are only examples and steps may be modified or added, without departing from the scope of the embodiments.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
a quick release system for installation of a module of a network communications system in a rack and removal of the module from the rack, the quick release system comprising:
a rack bracket for attachment to a front wall of a rack post of the rack, the rack bracket comprising a ground lug for receiving a ground wire to provide a ground connection; and
a module bracket for attachment to the module, the module bracket comprising a thumb screw for securely connecting the module bracket to the rack bracket
wherein the ground lug is positioned adjacent to a front face of the module comprising network interfaces when the module is installed in the rack; and
wherein the rack bracket further comprises a guide pin for insertion into a connector on the module bracket, wherein the guide pin and the connector provide a ground connection between the rack bracket and the module bracket.

2. The apparatus of claim 1 wherein one of the rack bracket and the module bracket comprises a rotatable lever for engagement with a hook on the other of the rack bracket and the module bracket.

3. The apparatus of claim 1 wherein the rack bracket and the module bracket each comprise a slide rail extending rearward from a front portion of the rack bracket or the module bracket for sliding engagement during insertion of the module.

4. The apparatus of claim 1 wherein the module comprises a 1RU (rack unit) line card.

5. The apparatus of claim 1 wherein the module comprises a 2RU (rack unit) or larger chassis for receiving components.

6. The apparatus of claim 1 wherein the module is in communication with other modules mounted on the rack to form a distributed network system.

7. The apparatus of claim 1 wherein the ground lug is located on the rack bracket for attachment to a left side of the rack and the rack bracket for attachment to a right side of the rack.

8. The apparatus of claim 1 wherein the module receives power over Ethernet from another module mounted on the rack.

9. The apparatus of claim 1 wherein the module receives power from another module mounted on the rack.

10. A distributed network system comprising:
a plurality of modules mounted on one or more racks; and
quick release systems for installation of the modules on said one or more racks and removal of the modules from said one or more racks, each of the quick release systems comprising:
two rack brackets attached to rack posts of one of the racks, at least one of the rack brackets comprising a ground lug receiving a ground wire providing a ground connection; and
two module brackets attached to opposite sides of one of the modules, each of the module brackets comprising a thumb screw for securely connecting the module bracket to the rack bracket;
wherein the ground lug is positioned adjacent to faces of the modules comprising network interfaces;
wherein the rack bracket further comprises a guide pin for insertion into a connector on the module bracket, wherein the guide pin and the connector provide a ground connection between the rack bracket and the module bracket.

11. The distributed network system of claim 10 wherein one of the rack bracket and the module bracket comprises a rotatable lever for engagement with a hook on the other of the rack bracket and the module bracket.

12. The distributed network system of claim 10 wherein the rack bracket and the module bracket each comprise a slide rail extending rearward from a front portion of the rack bracket or the module bracket for sliding engagement during insertion of the module.

13. The distributed network system of claim 10 wherein one of the modules comprises a 1RU (rack unit) line card.

14. The distributed network system of claim 10 wherein one of the modules comprises a 2RU (rack unit) chassis for receiving components.

15. A method for installing a module on a rack in a network communications system, the method comprising:
inserting the module between two rack posts of the rack;
aligning module brackets attached to opposite sides of the module with rack brackets attached to the rack posts; and
tightening thumb screws on the module brackets to securely connect the module brackets to the rack brackets;
wherein at least one of the rack brackets comprises a ground lug that remains on the rack coupled to a ground wire during removal of the module, the ground lug positioned adjacent to a face of the module comprising network interfaces when the module is installed in the rack; and
wherein aligning the module brackets with the rack brackets comprises aligning connectors on the module brackets with guide pins extending outward from the rack brackets, wherein the guide pins and the connectors provide a ground connection between the module bracket and the rack bracket.

16. The method of claim 15 wherein the module comprises a 2RU (rack unit) module in communication with other modules on the rack in a distributed network system and further comprising providing power to at least one of the other modules.

17. The method of claim 15 wherein the module comprises a 1RU (rack unit) line card.

* * * * *